United States Patent
Hwang et al.

[11] Patent Number: 6,140,603
[45] Date of Patent: Oct. 31, 2000

[54] MICRO-CLEAVAGE METHOD FOR SPECIMEN PREPARATION

[75] Inventors: Ruey-Lian Hwang; Yung-Sheng Huang, both of Hsin-Chu, Taiwan

[73] Assignee: Taiwan Semiconductor Manufacturing Co., Ltd, Hsinchu, Taiwan

[21] Appl. No.: 09/283,000

[22] Filed: Mar. 31, 1999

[51] Int. Cl.[7] .................................................. B23K 26/00
[52] U.S. Cl. ............................ 219/121.69; 219/121.68; 219/121.67; 219/121.6
[58] Field of Search .................... 219/121.69, 121.68, 219/121.67, 121.6, 121.72, 121.73, 121.85

[56] References Cited

U.S. PATENT DOCUMENTS

| | | | |
|---|---|---|---|
| 3,916,510 | 11/1975 | Martin | 29/583 |
| 4,236,296 | 12/1980 | Woolhouse et al. | 29/569 L |
| 4,660,275 | 4/1987 | Lo | 29/569 L |
| 5,254,833 | 10/1993 | Okiyama | 219/121.68 |
| 5,629,233 | 5/1997 | Chand et al. | 438/33 |
| 5,829,658 | 11/1998 | Colombani | 225/1 |

*Primary Examiner*—Patrick Ryan
*Assistant Examiner*—M. Alexandra Elve
*Attorney, Agent, or Firm*—Tung & Associates

[57] ABSTRACT

A micro-cleavage method for preparing a semiconductor specimen for examination by an optical or electron microscopic is disclosed. The method can be carried out by hand and thus no expensive equipment such as a polishing machine is necessary. In the method, at least two bird's beak marks are cut in a top surface of a silicon wafer that contains a target, i.e., a defect or a circuit to be examined. The bird's beak marks are formed by a wide scribe line and a narrow scribe line overlapped together. The wide scribe line of the bird's beak mark is used for visual alignment with the edge of a rigid substrate, while the fine scribe line is utilized for initiating a crack when a bending stress is applied on the bird's beak mark. The bird's beak mark can be made by using a laser cutter after a wafer slice which contains the target area is first cleaved by mechanical means such as a diamond knife. A first bird's beak mark is formed at the cleaved edge of the slice and a second bird's beak mark is formed with its fine scribe line oriented toward the target. When a bending stress is applied on the top surface of the silicon slice, stress concentrates on the bird's beak marks and creates a fine crack to propagate along a crystallographic plane in the wafer toward the target thus exposing the target in a fractured surface.

20 Claims, 2 Drawing Sheets

MICRO-CLEAVAGE METHOD FOR SPECIMEN PREPARATION

FIELD OF THE INVENTION

The present invention generally relates to a method for preparing a specimen from a semiconductor wafer and more particulary, relates to a manual method of micro-cleavage of a semiconductor wafer for preparing a specimen for cross-sectional examination.

BACKGROUND OF THE INVENTION

In the failure analysis of electronic structures, a specimen that contains a defect is frequently prepared for microscopic examination. For instance, a specimen of an electronic structure such as a semiconductor wafer may be analyzed in a scanning electron microscope (SEM) or a transmission electron microscope (TEM) to study a characteristic feature in the semiconductor device. The characteristic feature may be a circuit fabricated or a defect formed during the fabrication process. SEM is one of the most useful equipment for analyzing the microscopic structure of semiconductor devices since it is capable of providing a three-dimensional image on a specimen that can be simply prepared.

In preparing a specimen of a semiconductor wafer for electron microscopic examination, various polishing and milling processes are used for sectioning a structure until a specific characteristic feature is exposed. As device dimensions are continuously reduced to the sub-half-micron level, the techniques used for preparing specimens for study in an electron microscope have become more important. The conventional method of studying structures in an optical microscope cannot be used to study features in a modem electronic structure due to its low resolution.

Generally, when a specimen is prepared for an electronic microscopic observation of a characteristic feature, various polishing and grinding techniques are used to first bring the dimensions of a specimen down to a size just before the characteristic feature is revealed. A final sample preparation step is then carried out in a method such as ion milling by a focused ion beam (FIB) technique.

In a FIB technique, focused ion beams are used to locally remove materials. A cluster of an ionized beam consists of an aggregate of from 100 to 2,000 atoms is aimed at a sample surface. When the cluster impacts the surface of the electronic structure, the cluster disintegrates into atoms which are them scattered over the surface to remove a surface layer of the material. While the FIB technique is effective in preparing a specimen the microscopic examination of a semiconductor wafer, the cross-section prepared which contains the structural feature, or the defect, is frequently blurred and does not present a sharp contrast. This results in a micrograph of poor resolution. Moreover, the cost of a FIB equipment is high such that it cannot be provided at every fabrication facility. It is therefore desirable to provide a simple method for specimen preparation that can be carried out at a fabrication facility inexpensively.

It is therefore an object of the present invention to provide a method for preparing a semiconductor specimen that does not have the drawbacks or shortcomings of the conventional methods.

It is another object of the present invention to provide a micro-cleavage method for preparing a semiconductor specimen that can be performed manually without using expensive equipment.

It is a further object of the present invention to provide a micro-cleavage method for preparing a semiconductor specimen for optical microscope or electronic microscope observation.

It is another further object of the present invention to provide a micro-cleavage method for preparing a semiconductor specimen that only requires the use of a diamond knife and a laser cutter.

It is still another object of the present invention to provide a micro-cleavage method for preparing a semiconductor specimen wherein bird's beak-shaped marks are first made on a wafer surface.

It is yet another object of the present invention to provide a micro-cleavage method for preparing a semiconductor specimen by making bird's beak-shaped marks on the surface of a wafer such that a large base portion of the mark can be used for visual alignment, while a small tip portion of the mark can be used for initiating a crack.

It is still another further object of the present invention to provide a micro-cleavage method for preparing a semiconductor specimen wherein at least two bird's beak-shaped marks are cut into a surface of a wafer with one mark positioned juxtaposed to a wafer edge and at least one other mark positioned juxtaposed to a target to be observed.

It is yet another further object of the present invention to provide a micro-cleavage method for preparing a semiconductor specimen by first providing at least two bird's beak-shaped marks on a top surface of the wafer, then position the wafer on a straight ruler with the bird's beakshaped marks facing up, and then bending down the wafer surface to initiate a crack through a target to be observed.

SUMMARY OF THE INVENTION

In accordance with the present invention, a micro-cleavage method for preparing a semiconductor specimen that can be performed manually without expensive equipment is provided.

In a preferred embodiment, a micro-cleavage method for preparing a semiconductor specimen can be carried out by the steps of providing a semiconductor wafer which has a top surface, the wafer contains a target to be examined, cleaving a first cross-section in the wafer not more than 5 mm away from the target, making a first mark with radiation energy on the top surface juxtaposed to the first cross-section to a depth of less than 50 $\mu$m, the first mark has a length and a width sufficiently large such that the mark may be visible to human eyes, making a second mark with radiation energy in the top surface integral with the first mark to a depth of less than 50 $\mu$m, the second mark is oriented and cut to a width sufficiently small such that a crack can be initiated toward a target when a stress is applied on the first mark, making a third mark with radiation energy in the top surface juxtaposed to the target to a depth of less than 50 $\mu$m, the third mark may have a length and a width sufficiently large such that the third mark may be visible to human eyes, making a fourth mark with radiation energy on the top surface integral with the third mark to a depth of less than 50 $\mu$m, the fourth mark may be oriented and cut to a width sufficiently small such that a crack can be initiated toward the target when a stress is applied on the third mark, and applying a bending stress on the first and the third mark on the top surface of the wafer to cause a crack to be initiated through the wafer and the target to expose the target for observation.

In the micro-cleavage method for preparing a semiconductor specimen, the first cross-section cleaved may not be more than 3 mm away from the target. The first cross-section cleaved may be at a distance between about 0.5 mm and about 3 mm from the target. The first cross-section may be cleaved by mechanical means, such as by a diamond knife.

The semiconductor wafer may be fabricated of a single crystal material which enables the propagation of a crack along a crystallographic plane.

In the method, the radiation energy utilized in forming the first, second, third and fourth mark may be laser energy. The first, second, third and fourth mark may be cut to a depth of less than 30 $\mu$m. The radiation energy utilized may be a laser energy at a power density between about 0.2 mJ and 1.0 mJ. The radiation energy may be laser energy which has between about 80 pulses and about 160 pulses. The first and third mark may have a dimension between about 30 $\mu$m×30 $\mu$m and about 50 $\mu$m×50 $\mu$m. The first and third mark may have a width of at least 30 $\mu$m. The first mark which is integral with the second mark and the third mark which is integral with the fourth mark may have a bird's beak configuration. The bending stress is applied on the first and third mark when the wafer is positioned on a straight edge aligned to the first and third mark.

In an alternate embodiment, a method of micro-cleavage for preparing a semiconductor specimen may be carried out by the operating steps of first providing a silicon wafer which has a top surface and a target to be examined under the top surface, cutting a first cross-section in the wafer within a 5 mm distance from the target, making a first bird's beak mark to a depth of 50 $\mu$m on the top surface of the wafer, the first bird's beak mark has a large base portion juxtaposed to the first cross-section and a small tip portion pointed substantially at the target, making a second bird's beak mark to depth of less than 50 $\mu$m on the top surface of the wafer, the second bird's mark is positioned juxtaposed to the target and is pointed at the target by a small tip portion of the mark, providing a rigid surface that has a 90°, linear edge, positioning the silicon wafer on the rigid surface with the first and second bird's beak mark facing upwardly and aligned to the 90° linear edge, and bending the silicon wafer downwardly on the 90° linear edge until a micro-cleavage is formed in the wafer exposing the target.

In the method of micro-cleavage for preparing a semiconductor specimen, the first cross-section may be cut mechanically by a diamond knife. The first cross-section may be cut within a 3 mm distance from the target. The method may further include the step of making the first and second bird's beak mark by radiation energy, or the step of making the first and second bird's beak mark by laser irradiation. The rigid surface which has a 90°, linear edge may be a metal ruler.

BRIEF DESCRIPTION OF THE DRAWINGS

These and other objects, features and advantages of the present invention will become apparent by considering the following detailed description and the appended drawings in which.

DETAILED DESCRIPTION OF THE PREFERRED EMBODIMENT

The present invention discloses a manual micro-cleavage method for preparing a semiconductor specimen for an optical or electron microscope observation. The method can be used to examine a specific structure feature, such as a defect or a circuit in a semiconductor wafer. While the method can be utilized for any type of semiconductor wafers, it is particulary suitable for use in wafers that are fabricated of a single crystal material such as silicon such that a crack may be initiated and its propagation can be controlled in a preferred orientation.

The major advantages provided by the present invention method are two-folds. First, the micro-cleavage method can be conducted without the use of any expensive polishing equipment since the cleavage can be formed by hand. Secondly, the present invention method can be carried out in a short period of time, i.e., a sample can be prepared with a target area exposed in fifteen minutes. The present invention method can therefore be utilized in any fabrication facility where an optical microscope may be available for failure analysis or for quality control and reliability studies.

In the novel method, bird's beak-shaped marks are provided on the surface of a silicon wafer by laser irradiation. This is performed by first severing a semiconductor wafer by utilizing a diamond cutter such that a cross-section preferably within a 5 mm distance from a target is formed. The shape of the marks, i.e., a bird's beak or a peck mark, is important for two reasons. First, a large base portion of the bird's beak mark is used for visual observation by a technician who prepares the sample. A small tip portion which is integral with the large base portion, i.e., the sharp point of the bird's beak, is oriented in alignment with the target area such that once a crack is initiated in the large base portion, a crack propagation along a controlled direction through the target area may be achieved. For instance, in a silicon wafer, the wafer may be cleaved in a desired crystallographic plane based on its single crystal structure.

The present invention novel method greatly improves the accuracy of a conventional manual cutting method in which a sample is cut to expose a cross-sectional surface of a target to be observed. The accuracy achievable by the present invention method can reach ±15 $\mu$m, while the minimum wafer segment size may be down to 5 mm×5 mm. For preparing samples by the present invention novel method, only a diamond cutter and a laser cutter are required without the need for an expensive polishing apparatus.

Figure 1:
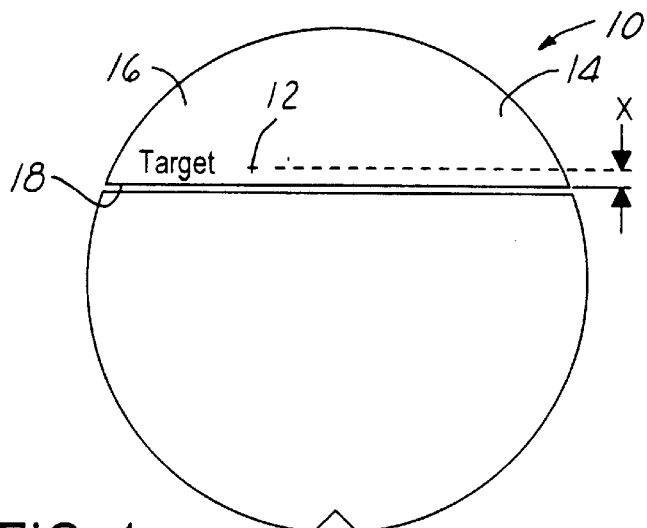
FIG. 1 is a plane view of a present invention silicon wafer having a target for examination marked on top.
Figure 1A:
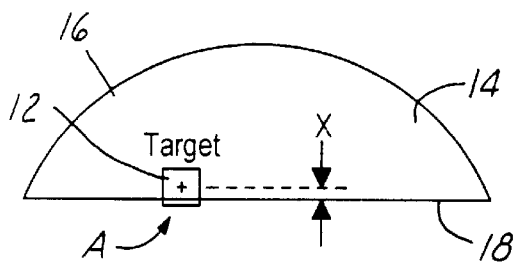
FIG. 1A is a plane view of a present invention silicon wafer containing the target after the part that contains the target is severed by a diamond knife.

Referring initially to FIG. 1, wherein a present invention silicon wafer 10 is shown. Silicon wafer 10 contains a target 12, i.e., a defect in a circuit to be observed, underneath a top surface 14 of the wafer 10. To practice the present invention novel method, a coarse cleaving step is first used to cleave a silicon slice 16 by using mechanical means, such as by a diamond knife or cutter. The fractured plane 18 should be close enough to the target 12 by a distance between about 0.5 mm and about 5 mm. A distance small than 3 mm is more preferred. This is shown as x in FIGS. 1 and 1A.

Figure 1B:
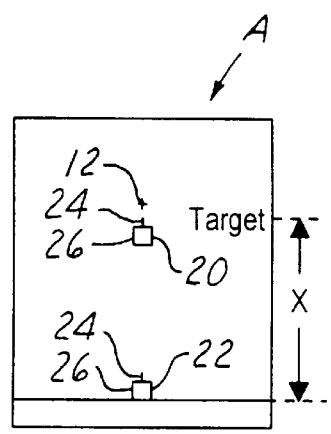
FIG. 1B is an enlarged partial view of area A shown in FIG. 1A illustrating the placement of two bird's beak marks.
Figure 1C:
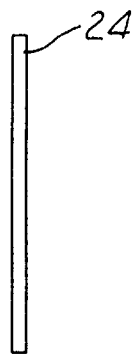
FIG. 1C is an enlarged, plane view of a tip portion of a bird's beak mark representing a fine scratch in the surface of the wafer.
Figure 1D:
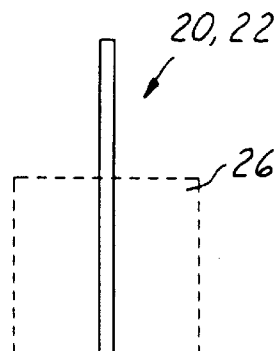
FIG. 1D is an enlarged, plane view of a present invention bird's beak mark complete with a tip portion and a base portion formed by laser cutting.

After the silicon slice 16 is severed from the silicon wafer 10 with the cross-sectional surface 18 exposed, a specific target area "A" is selected which includes the target 12 to be observed. An enlarged view of area "A" is shown in FIG. 1B. Bird's beak-shaped marks 20, 22 are then cut into the top surface 14 of the silicon slice 16. The procedure for cutting the bird's beak marks or the peck marks is important. First, the silicon slice 16 is placed in a laser cutter and the fractured plane 18 is aligned with the theta axis, i.e., perpendicular to the x-axis or the y-axis of the cutter stage. A bird's beak mark 22 which registers the target 12 as an initiation fracture zone is made by laser cutting on the edge 18 of the slice 16. Along the x-axis or the y-axis, laser cutting at a power level between about 0.2 mJ and about 1.0 mJ, and preferably at 0.6 mJ, is utilized. The laser radiation is used at between about 80 pulses and about 160 pulses, preferably at about 120 pulses. The laser radiation causes a line damage to approximately between about 20 $\mu$m and about 50 $\mu$m deep from the edge 18 of the slice 16. A fine scribe line 24 is made as narrow as possible by the laser cutter. This is shown in FIG. 1C. A wider scribe line 26 that has approximately 30 $\mu$m or more in width is then superimposed on top of the fine scribe line 24. This is shown in FIG. 1D. It is important that the fine scribe line 24, or the small tip portion of the bird's beak mark, and the coarse scribe line 26, or a large base portion of the bird's beak mark, must overlap and be formed integrally. Furthermore, the wide scribe line 26 of the bird's beak mark 22 must be formed on the slice edge 18 so that a bending stress can be readily applied thereon. The reason for the overlap between the fine scribe line 24 and the wide scribe line 26 is that any bending stress applied on the wide scribe line 26 must be readily transferred to the fine scribe line 24 such that a fine crack may be initiated in the crystal plane toward the target 12.

When it is difficult to register a single bird's beak mark on the slice edge 18 to the target 12, e.g., due to the poor accuracy of the X (or Y) direction translation of the laser cutting stage, more than one bird's beak mark should be provided along the intended cleavage direction across the slice edge 18. It is essential that the closest bird's beak mark to the target 12 must register exactly to the target 12.

Figure 2:
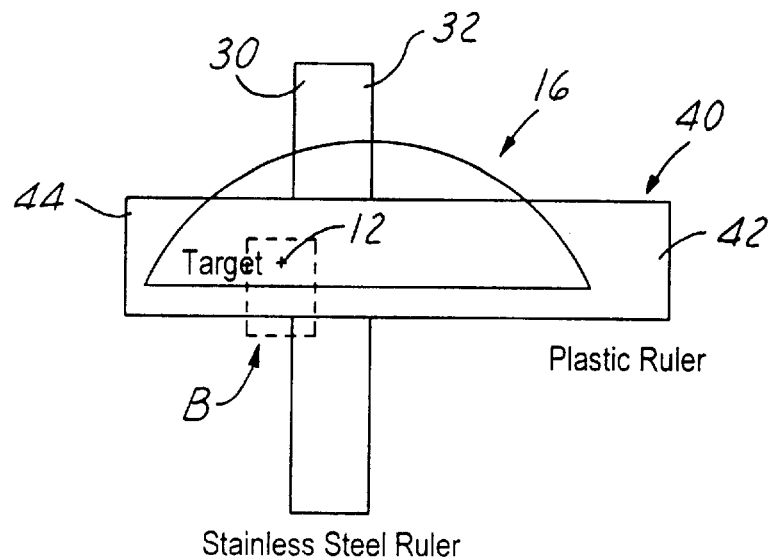
FIG. 2 is a plane view illustrating the present invention method when a wafer slice is placed on a rigid ruler and then covered by a flexible plastic plate.
Figure 2A:
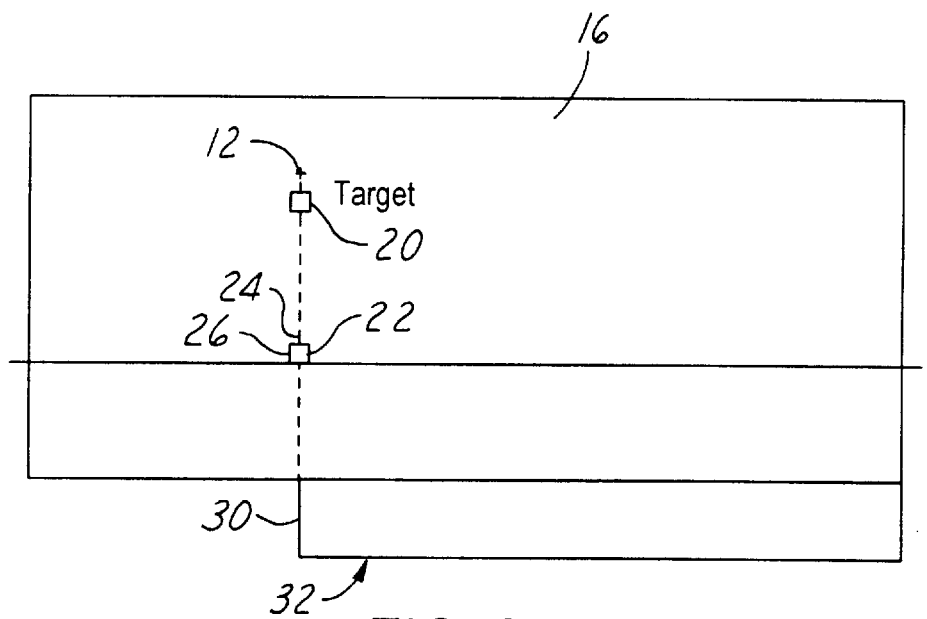
FIG. 2A is an enlarged, plane view of area B shown in FIG. 2 illustrating the two bird's beak marks in an aligned relationship with a target and a linear edge of the ruler.

The present invention novel method may be carried out by the operating steps as presented below. To perform the micro-cleavage process, the bird's beak marks 20, 22 must first be aligned on the edge of a rigid substrate, i.e., such as a metal ruler. This is shown in FIGS. 2 and 2A. The edge of the metal ruler must have a sharp edge or a 90° angle bend. The rigid edge 30 of the object 32, i.e., a stainless steel ruler, must be positioned under the silicon slice 16 to register with the target 12 along a desired cleavage propagation direction, aligned with the bird's beak marks 20, 22. On top of the silicon slice 16, is then placed a flexible plate such as a plastic plate or a plastic ruler 40. The plastic plate 40 is preferably made of a transparent or a semi-transparent material such that its position relative to the silicon slice 16 can be readily determined.

With the bird's beak marks 20, 22 aligned with the rigid edge 30 of the metal ruler 32, the two ends 42, 44 are then deflected downwardly exerting a bending stress on the silicon slice 16 that is positioned underneath. A light pressure by hand is normally sufficient to cause a bending stress to be exerted on the base portion 26 of the bird's beak mark 22 and then transferred to the tip portion 24 to initiate a crack propagation in the silicon wafer from the end of the tip portion 24. The crack produced generally propagates from bird's beak mark 22 toward the bird's beak mark 20 at near the target area 12. It is noted that a crack is always initiated from the bird's beak mark 22 formed on the edge of the silicon slice 16 to proceed along the direction of the mark across the silicon slice toward the opposite edge of the slice, i.e., toward the second bird's beak mark positioned at the target area. Both sides of a split target are therefore exposed for examination.

By utilizing the novel present invention method, a high quality cross-sectional area can be obtained in a short sample preparation time of about 15 minutes while achieving an accuracy to approximately ±15 $\mu$m. It should be noted that an enlarged view of box "B" in FIG. 2 is shown in FIG. 2A. The dashed line shown in FIG. 2A shows that the two bird's beak marks are lined up with the sharp edge 30 of the metal ruler 32, or the rigid substrate positioned underneath the silicon slice 16.

As shown in FIG. 1D, a suitable size for the large base portion 26 of the bird's beak marks 20, 22 is about 30 $\mu$m×30 $\mu$m, or any other dimensions that are smaller than 50 $\mu$m×50 $\mu$m. A suitable depth of the wide scribe line, or the large base portion 26, and the fine scribe line, or the small tip portion 24 is approximately 30 $\mu$m, or any other depth that is less than 50 $\mu$m. It should be noted that, while as shown in FIG. 2 a bending stress is applied by hand, any machine such as a press may be used to produce the same desirable result as long as the basic requirements for the present invention novel method are met.

The present invention novel method for micro-cleavage by hand for preparing a semiconductor specimen has been amply described in the above descriptions and in the appended drawings of FIGS. 1~2A. While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the invention.

The embodiment of the invention in which an exclusive property or privilege is claimed are defined as follows:

1. A micro-cleavage method for preparing a semiconductor specimen comprising the steps of:

providing a semiconductor wafer having a top surface, said wafer containing a target to be examined, cleaving a first cross-section in said wafer not more than 5 mm away from said target, making a first mark with radiation energy on said top surface juxtaposed to said first cross-section to a depth of less than 50 $\mu$m, said first mark having a length and a width sufficiently large such that said first mark is visible to the human eyes, making a second mark with radiation energy on said top surface integral with said first mark to a depth of less than 50 $\mu$m, said second mark being oriented and formed to a width sufficiently small such that a crack is initiated toward said target when a stress is applied on said first mark, making a third mark with radiation energy on said top surface juxtaposed to said target to a depth of less than 50 $\mu$m, said third mark having a length and a width sufficiently large such that said third mark is visible to human eyes, making a fourth mark with radiation energy on said top surface integral with said third mark to a depth of less than 50 $\mu$m, said fourth mark being oriented and formed to a width sufficiently small such that a crack is initiated toward said target when a stress is applied on said third mark, and applying a bending stress on said first and third mark on said top surface of the wafer to cause a crack initiated through said wafer and said target to expose said target.

2. A micro-cleavage method for preparing a semiconductor specimen according to claim 1, wherein said first cross-section being cleaved is not more than 3 mm away from said target.

3. A micro-cleavage method for preparing a semiconductor specimen according to claim 1, wherein said first cross-section being cleaved is at a distance between about 0.5 mm and about 3 mm from said target.

4. A micro-cleavage method for preparing a semiconductor specimen according to claim 1, wherein said first cross-section is cleaved by mechanical means.

5. A micro-cleavage method for preparing a semiconductor specimen according to claim 1, wherein said first cross-section is cleaved by a diamond knife.

6. A micro-cleavage method for preparing a semiconductor specimen according to claim 1, wherein said semiconductor wafer is fabricated of a single crystal material which propagates a crack along a crystallographic plane.

7. A micro-cleavage method for preparing a semiconductor specimen according to claim 1, wherein said first, second, third and fourth mark being formed by laser energy.

8. A micro-cleavage method for preparing a semiconductor specimen according to claim 1, wherein said first, second third and fourth mark being cut to a depth of less than 30 $\mu$m.

9. A micro-cleavage method for preparing a semiconductor specimen according to claim 1, wherein said radiation energy utilized is a laser energy having a power of between about 0.2 mJ and about 1.0 mJ.

10. A micro-cleavage method for preparing a semiconductor specimen according to claim 1, wherein said radiation energy utilized is a laser energy having between about 80 pulses and about 160 pulses.

11. A micro-cleavage method for preparing a semiconductor specimen according to claim 1, wherein said first and third mark having a dimension between about 30 $\mu$m×30 $\mu$m and about 50 $\mu$m×50 $\mu$m.

12. A micro-cleavage method for preparing a semiconductor specimen according to claim 1, wherein said first and third mark having a width of at least 30 $\mu$m.

13. A micro-cleavage method for preparing a semiconductor specimen according to claim 1, wherein said first mark being integral with said second mark and said third mark being integral with said fourth mark are formed in a bird's beak configuration.

14. A micro-cleavage method for preparing a semiconductor specimen according to claim 1, wherein said bending stress is applied on the first and third mark when the wafer is positioned on a rigid edge aligned to the first and third mark.

15. A method of micro-cleavage for preparing a semiconductor specimen comprising the steps of:

providing a silicon wafer having a top surface and a target to be examined under said top surface, cutting a first cross-section in said wafer within a 5 mm distance from said target, making a first bird's beak mark to a depth of less than 50 $\mu$m in said top surface of the wafer, said first bird's beak mark having a large base portion juxtaposed to said first cross-section and a small tip portion pointing substantially at said target, making a second bird's beak mark to a depth of less than 50 $\mu$m in said top surface of the wafer, said second bird's beak mark being positioned juxtaposed to said target to be examined and being pointed at said target by a small tip portion of the mark, providing a rigid surface having a 90°, linear edge, positioning said silicon wafer on said rigid surface with said first and second bird's beak marks facing upwardly and aligned to said 90°, linear edge, and bending said silicon wafer downwardly on said 90°, linear edge until a micro-cleavage is formed in said wafer exposing said target.

16. A method of micro-cleavage for preparing a semiconductor specimen according to claim 15, wherein said first cross-section is cut mechanically by a diamond knife.

17. A method of micro-cleavage for preparing a semiconductor specimen according to claim 15, wherein said first cross-section is cut within 3 mm from the target.

18. A method of micro-cleavage for preparing a semiconductor specimen according to claim 15 further comprising the step of making the first and second bird's beak mark by radiation energy.

19. A method of micro-cleavage for preparing a semiconductor specimen according to claim 15 further comprising the step of making the first and second bird's beak marks by laser irradiation.

20. A method of micro-cleavage for preparing a semiconductor specimen according to claim 15, wherein said rigid surface having a 90°, linear edge is a metal ruler.

* * * * *